[12] United States Patent
Chillarige et al.

(10) Patent No.: US 10,996,270 B1
(45) Date of Patent: May 4, 2021

(54) SYSTEM AND METHOD FOR MULTIPLE DEVICE DIAGNOSTICS AND FAILURE GROUPING

(71) Applicant: CADENCE DESIGN SYSTEMS, INC., San Jose, CA (US)

(72) Inventors: Sameer Chillarige, Greater Noida (IN); Joe Swenton, Owego, NY (US); Anil Malik, New Delhi (IN); Krishna Chakravadhanula, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 143 days.

(21) Appl. No.: 16/128,177

(22) Filed: Sep. 11, 2018

(51) Int. Cl.
*G01R 31/3177* (2006.01)
*G01R 31/317* (2006.01)
*G01R 31/00* (2006.01)
*G06F 16/28* (2019.01)
*G01R 31/3183* (2006.01)

(52) U.S. Cl.
CPC ... *G01R 31/3177* (2013.01); *G01R 31/31703* (2013.01); *G01R 31/318342* (2013.01); *G06F 16/285* (2019.01)

(58) Field of Classification Search
None
See application file for complete search history.

(56) References Cited

U.S. PATENT DOCUMENTS 9,400,311 B1  7/2016  Malik et al.

OTHER PUBLICATIONS

S. Chillarige, A. Malik, S. Singh, J. Swenton and K. Chakravadhanula, "High throughput multiple device diagnosis system," 2017 IEEE International Test Conference (ITC), Fort Worth, TX, 2017, pp. 1-10.*
CMOS Digital Integrated Circuits, Analysis and Design, Sung-Mo Kang et al., McGraw Hill Edition, 3rd ed. (2003), Chapter 15, Design for Testability, pp. 622-626.
Teo et al., "Uncovered the 'hidden real defect' masked by 'other anomaly seen' through deep dive FA in wafer fabrication," published at the 2017 IEEE 24th International Symposium on the Physical and Failure Analysis of Integrated Circuits, Jul. 4-7, 2017 (5 pages total).

* cited by examiner

*Primary Examiner* — Justin R Knapp
(74) *Attorney, Agent, or Firm* — Tarolli, Sundheim, Covell & Tummino LLP (57) ABSTRACT

Systems and methods for multiple device diagnostics are disclosed herein. Exemplary embodiments provide for a multiple device diagnostic system having a plurality of electronic devices selected for diagnosis based on at least one selection criterion, a diagnosis engine in data communication with a failure database, and a diagnosis results database in data communication with the diagnosis engine. Embodiments further provide that the failure database contains grouped failure data from at least one previously diagnosed electronic device, that the wherein the processor diagnoses defects in one or more of the plurality of electronic devices using the grouped failure data, and that the processor outputs the diagnosis results to the diagnosis results database.

20 Claims, 5 Drawing Sheets

SYSTEM AND METHOD FOR MULTIPLE DEVICE DIAGNOSTICS AND FAILURE GROUPING

FIELD OF THE INVENTION

This disclosure relates to diagnostics, and more specifically, to systems and methods for grouping failures for use in multiple device diagnostics.

BACKGROUND

The manufacture of any device, including electronic devices, may occasionally produce defective articles. This is true for the mass manufacture of electronic devices, such as integrated circuits. Any such electronic devices may contain manufacturing defects, and accordingly the diagnosis of such flaws is a necessary part of any manufacturing operation.

Diagnosing errors in manufactured articles may be a time-consuming and labor-intensive process. The small scale and delicate nature of electronic devices and their components frequently precludes visual inspection. Instead, testing may be automated and performed by supplying a known input or instruction to a device and determining whether the expected output is received or the expected function is performed. Even automated testing processes may be unable to individually test mass produced electronic devices and diagnose flaws in a feasible manner. Accordingly, methods of multiple device diagnoses ("MDD") have been developed to diagnose flaws in multiple devices at the same time, examples of which are described in U.S. Pat. No. 9,400,311, the contents of which are incorporated herein by reference.

Automated testing has a number of requirements, including the need to identify potential defects, specify test procedures, and correctly interpret the results to accurately diagnose defects, all of which require time, effort, and resources. There are numerous ways that an electronic device may be defective, however, and this problem may be compounded by the quantity of electronic devices produced by mass manufacturing. Further, performing the automated testing of multiple devices to detect flaws consumes personnel and system resources, and may often demand a significant memory footprint and significant run time. As a result, automated testing may be parallelized to more quickly obtain diagnosis results. Nonetheless, continually increasing design sizes and the addition of technology nodes to the devices reduces the number of diagnosis jobs that can be performed with without continually increasing the hardware employed.

Accordingly, there is a need to efficiently identify defects in electronic devices and efficiently diagnose defects in multiple devices.

DETAILED DESCRIPTION

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide systems and methods for multiple device diagnostics, including systems and methods for identifying and grouping failures to facilitate more efficient testing and defect diagnosis.

Multiple device diagnosis according to embodiments of the prevent disclosure may be applied to a wide range of mass manufactured electronic devices, including such as integrated circuits ("ICs"), printed electronics, circuit boards or other circuit implementations, whether stand-alone or components of other devices. These devices may be relatively simple or highly complex, and may suffer one or more of a myriad of defects, including defects caused by contact failures, electrical failures, packaging failures, printed circuit board failures, logical failures, relay failures, delay failures, semiconductor failures, microelectromechanical failures, passive element failures, and physical failures. While the foregoing is exemplary, it is understood that the systems and methods of the present disclosure are not limited thereto and instead apply to any damage, failures, faults, or flaws that may affect the function or structure of a device or otherwise cause a device to become defective.

While exemplary embodiments are directed to multiple device diagnosis it is understood that the diagnosis systems and methods of the present disclosure may also be applied to the testing and diagnosis of individual devices.

According to an embodiment, a multiple device diagnostic system includes a plurality of electronic devices selected for diagnosis based on at least one selection criterion; a diagnosis engine in data communication with a failure database; and a diagnosis results database in data communication with the diagnosis engine, wherein the failure database contains grouped failure data from at least one previously diagnosed electronic device, wherein the processor diagnoses defects in one or more of the plurality of electronic devices using the grouped failure data, wherein the processor outputs the diagnosis results to the diagnosis results database.

According to an embodiment, a method for diagnosing multiple electronic devices, including selecting a plurality of electronic devices for diagnosis based on at least one selection criterion; diagnosing defects in one or more of the plurality of electronic devices by a diagnosis engine using grouped failure data from at least one previously diagnosed electronic devices; outputting the diagnosis results to a diagnosis results database.

According to an embodiment, a method of grouping failure data for use in multiple device diagnosis includes classifying a plurality of failing devices into one or more first-level groups based on at least one classification criteria; determining whether identical failing patterns exist between failing devices within any first-level group; for failing devices having identical failing patterns, classifying failing devices having identical failing patterns into one or more second-level groups, determining whether identical failing patterns between failing devices within any second-level group, classifying failing devices having identical failures into one or more third-level groups, and classifying failing devices having non-identical failures into one or more fourth-level groups; and for failing devices having non-identical failing patterns, classifying failing devices into one or more fifth-level groups.

Figure 1:
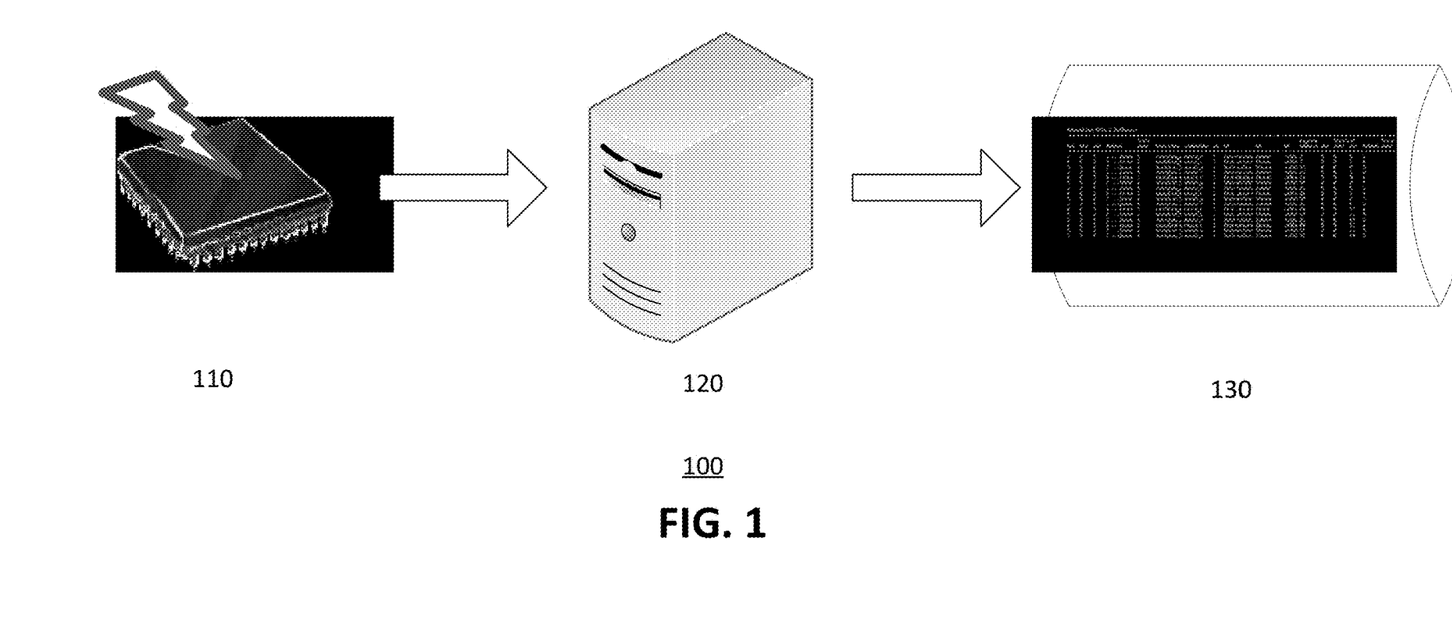
FIG. 1 illustrates an example embodiment of a single device diagnostic system.

FIG. 1 illustrates a single device diagnostic system 100 according to an example embodiment. As shown in FIG. 1, the single device diagnostic system 100 includes an electronic device 110, a diagnosis engine 120, and a diagnosis results database 130. In an embodiment, the electronic device 110 may be a single device, such as a single integrated circuit, for example. The diagnosis engine 120 may be software program capable of identifying defects in electronic devices, and the software program may be locally stored on a desktop computer or other dedicated diagnosis platform, or available remotely via a network drive or cloud location. The diagnosis engine 120 may be executed by a processor or multiple processors and may be connected with computer peripherals, such as a monitor, printer, and input/output devices. For example, the diagnosis engine 120 may be stored upon and/or executed by a desktop computer, a laptop computer, a tablet computer, a smartphone, a server, or other computing machine, or any combination of these machines. If multiple machines are employed, a data communication between the machines can be implemented using wired, wireless, or network connections.

In an embodiment the diagnosis engine 120 may be supported by testing hardware, including one or more multimeters, ohmmeters, test probes and leads, read/write ports, moisture meters, voltage meters, continuity testers, thermometers, sound level meters, light testers, humidity meters, pressure meters, and thermocouples. While this testing hardware is listed as exemplary, it is understood that the systems and methods of the present disclosure are not limited thereto and instead may incorporate any testing equipment capable of providing computer-readable data input. The diagnostic engine 120 may perform testing on the single electronic device and determine whether the testing identifies the presence of a particular defect. In an embodiment, the diagnostic engine 120 may not determine the presence of a specific defect, but may identify that a device is functioning improperly or has sustained structural damage, and may collect additional data related to this identification. Alternatively, the diagnosis engine 120 may identify defects based on the previously collected testing data. These identifications may serve as the basis for subsequent diagnoses, including diagnoses based upon information that is subsequently collected by further device testing and diagnosis.

In an embodiment, the diagnosis engine 120 may not perform testing and may instead identify defects based on previously collected testing data. In an embodiment, the diagnosis engine 120 may perform testing and/or diagnosis by simulation.

In an embodiment, the diagnosis engine 120 may be in data communication with the diagnosis results database 130. The database 130 may store the results of the testing and diagnosis performed by the diagnostic engine 120. The database 130 may be a relational database, a non-relational database, or another form of database, and may be configured to support the testing and diagnosis performed by the diagnosis engine 120. The database 130 may be stored locally, such as in memory on the same computer or diagnosis platform that supports the diagnosis engine 120 (this memory includes both internal and external memory, e.g., a hard drive or a flash drive), or may be available remotely via a network drive or cloud location.

In an embodiment, the diagnosis engine 120 may test and diagnose multiple electronic devices 110. This diagnosis may be performed individually on each electronic device 110, in order to identify particular defects that may be present. It is understood that each electronic device 110 may be free of defects, or may be include one or more defects. The testing and diagnosis performed by the diagnosis engine 120 may be designed to identify certain defects, and may be adapted, manually or automatically, to identify additional defects based on the results generated by previous testing.

In embodiments, dozens, hundreds, or thousands of potentially defective electronic devices 110 may be individually tested and diagnosed by the diagnosis engine 120, and the results of these diagnoses may be stored in the diagnosis results database 130. The results collected in database 130 may be statistically analyzed to identify defects, yield issues in manufacturing, and/or other flaws, or potential flaws, in design, materials, production, or manufacturing. In an embodiment, the information contained in database 130 may form the basis for the subsequent diagnosis of multiple devices.

Figure 2:
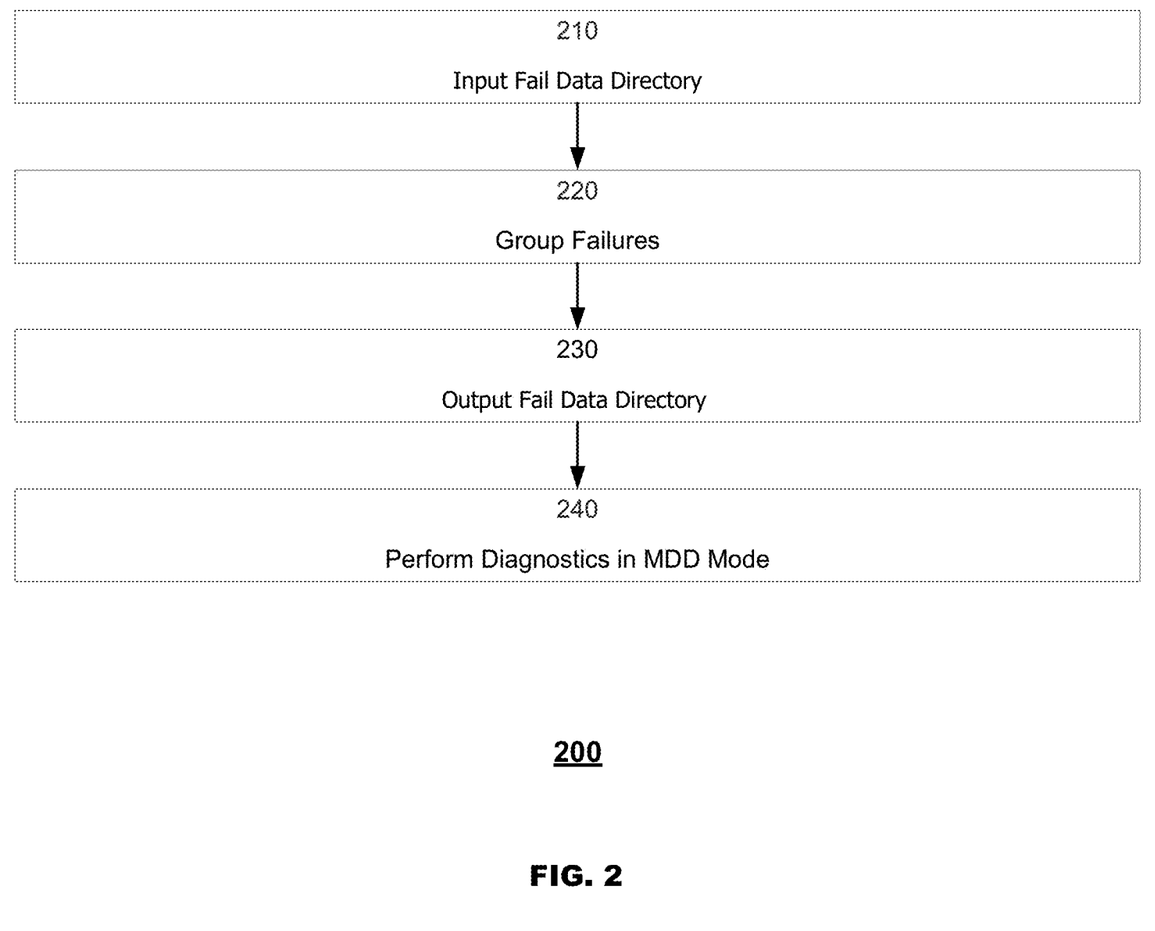
FIG. 2 illustrates an example embodiment of a multiple device diagnostics method.

FIG. 2 illustrates an example embodiment of a multiple device diagnostics method 200. As shown in FIG. 2, the multiple device diagnostics method 200 includes the steps of inputting a fail data directory 210, grouping failures 220, outputting a fail data directory, and performing diagnostics in multiple data diagnostics mode. The multiple device diagnostics method 200 may be performed by a diagnosis engine (not shown in FIG. 2). The diagnosis engine may be the diagnosis engine 120 previously discussed with reference to FIG. 1.

In an embodiment, during step 210 a fail data directory may be input into the diagnosis engine. The fail data directory may extracted from the results of previous diagnoses. For example, the fail data directory may be extracted from the diagnosis results database 130 previously discussed with reference to FIG. 1. In an embodiment, the diagnosis results database 130 may have been configured and populated in anticipation of subsequent use in a multiple device diagnosis processes.

In an embodiment, during step 220 the failures input from the fail data directory may be grouped. In this process, failures having similar characteristics may be grouped together. Exemplary criteria that may be used to group failures includes similarity of failing patterns and subsumability of failing patterns. For example, subsumability of failing patterns may refer to failing patterns having the same clocking template, and may also refer to failing patterns that can be simulated in parallel. Other exemplary criteria include similarity of results for one or more tests, failing a test in a similar manner, providing a similar result to a specific element of testing equipment, similarity of design, similarity of manufacturing, manufacturing batch commonality, manufacturing batch similarity, similarity of assembly, similarity of materials used, similarity of component suppliers, timing of failure detection, and operational criteria such as temperature, response time, and timing of occurrence of failure. As further examples, the failure data may be grouped on one or more properties associated with the failure, e.g., a failing pattern, a failing event, a failing pad, a failing scan offset, or a failing value, and the failure data may be grouped on the location of the device on the manufactured wafer or the lot information of the device. These criteria may be used individually or in combination with one or more other listed failures, or with other criteria. A further discussion of grouping failure data is provided with reference to FIG. 3.

In an embodiment, during step 230 the grouped failure data may be outputted from the diagnosis engine into an output fail data directory. The output fail data directory may be stored locally on the same computer or diagnosis platform that supports the diagnosis engine (in internal or external memory), or may be available remotely via a network drive or cloud location. The output fail data directory may be a relational database, a non-relational database, or another form of database. Further, the output fail data directory may be configured based on the particular failure data groupings generated by the diagnosis engine, to facilitate the efficient input of this data from the diagnosis engine. The output fail data directory may also be configured to facilitate the efficient lookup, analysis, and export of failure data during subsequent testing or diagnosis.

In an embodiment, during step 240 a multiple device diagnosis may be performed. In this step, one or more electronic devices may be assembled into a pool for testing and diagnosis by a diagnosis engine. The pooled electronic devices may be similar to the electronic device 110 previously discussed with reference to FIG. 1. In an embodiment, the electronic devices may be assembled into pools randomly or based on similarities between the devices to be pooled, similarities between the devices to be pooled and the devices previously tested, similarities between the devices to be pooled and the grouped failure data, or combinations thereof. Exemplary similarities that may be used in pooling the devices for the multiple device diagnosis process include similarity of design, similarity of manufacturing, similarity of operation, similarity of assembly, similarity of materials, similarity of components, similarity of function, and similarity of manufacturer. While the foregoing categories of similarities are listed as exemplary, it is understood that the systems and methods of the present disclosure are not limited thereto and instead apply to similarities in any relevant or potentially relevant characteristics.

In an embodiment, the multiple device diagnosis performed during step 240 may diagnose electronic devices and identify devices that contain defects. The diagnosis engine may diagnose all pooled devices in one diagnostic session, as opposed to the individual testing and diagnosis performed by the single device diagnosis process discussed above.

A multiple device diagnosis performed in accordance with embodiments of the present disclosure may generate significant gains in efficiency, performance, and throughput from existing hardware. For example, with the benefit of the failure groupings, the run time for the multiple device diagnosis may be greatly reduced in comparison to the single device diagnosis illustrated in FIG. 1. For example, the multiple device diagnosis may diagnose many devices, e.g., tens, hundreds, thousands, or more devices, in considerably less run time. The multiple device diagnosis may exhibit run time gains of 10× or more when the electronic devices are pooled randomly, and may exhibit greater gains when the devices are pooled based on similarities between the devices to be pooled, similarities between the devices to be pooled and the devices previously tested, similarities between the devices to be pooled and the grouped failure data, or combinations thereof.

Figure 3:
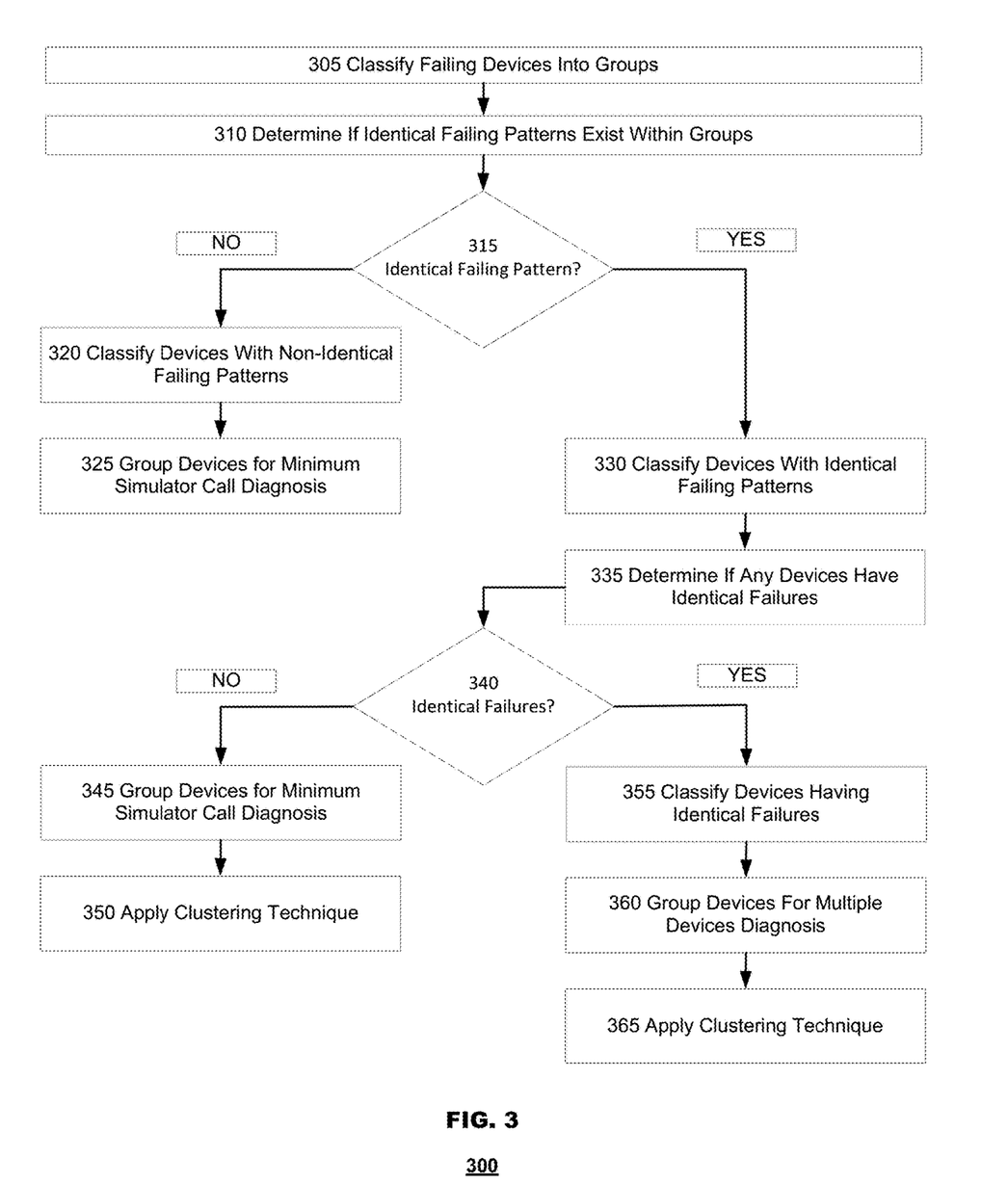
FIG. 3 illustrates an example embodiment of a failure grouping method utilized by the multiple device diagnostic method of FIG. 2.

FIG. 3 illustrates an example embodiment of a failure grouping method 300 utilized by the multiple device diagnostic method 200 shown in FIG. 2. For example, the failure grouping method 300 may be performed during step 220 of the multiple device diagnostic method 200. In an embodiment, the failure grouping method 300 may be performed by a diagnosis engine, such as the diagnosis engine described above with respect to FIG. 2, using the fail data directory input during step 210.

In an embodiment, during step 305 the diagnosis engine classifies the failing devices into groups based on specified criteria. For example, the diagnosis engine may classify the failing devices based on the subsumability of failing patterns, where subsumable patterns are failures that have the same clocking template such that they may be simulated in parallel.

In an embodiment, during step 310 the diagnosis engines determines whether any identical failure patterns existing within a group. As shown in FIG. 3, a different process may be applied to identical and non-identical failing patterns with the groups created in step 305, as illustrated by step 315.

In an embodiment, there may be devices having failing patterns that are not identical to the failing patterns of other devices within a group. In these cases, the failure grouping process 300 takes the "NO" option at step 315, and proceeds to step 320. During step 320, the devices with non-identical failing patterns are identified and assembled for further classification amongst themselves. In an embodiment, the failure grouping process may also take the "NO" option at step 315 and identify and assemble devices that lack failing patterns that fit within a subsumable group with other devices in step 320.

In an embodiment, during step 325, the devices with non-identical failing patterns may be grouped. For example, devices with non-identical failing patterns may be grouped such that diagnosis may be performed in a reduced or minimized number of simulator calls. In an embodiment, these devices may be grouped so as to require a reduced or minimized number of simulator calls in a single cell parallel pattern single fault propagation simulator for diagnosis. Accordingly, the failure grouping process of the present disclosure may result in more efficient testing and diagnosis for devices having non-identical failing patterns.

Returning to step 310, in an embodiment the diagnosis engine 300 may identify devices having failing patterns that are identical to others within a group. In these cases, the failure grouping process take the "YES" option at step 315, and proceeds to step 330. During step 330, the devices with identical failing patterns are identified and assembled for further classification among themselves.

In an embodiment, during step 335, the diagnosis engine determines whether any devices with have identical failures to any other devices having identical failing patterns. In an embodiment, there may be devices with identical failing patterns that do not have identical failures to other devices with the same failing patterns. In these cases, the failure grouping process 300 takes the "NO" option at step 340 and proceeds to step 345.

In an embodiment, during step 345, the devices with non-identical failures may be grouped with other such devices. For example, these devices may be grouped with other devices having identical failing patterns despite having non-identical failures. In an embodiment, these devices may be grouped in order to require a reduced or minimized number of simulator calls in a single cell parallel pattern single fault propagation simulator for diagnosis. Accordingly, the failure grouping process of the present disclosure may result in more efficient testing and diagnosis for devices having identical failing patterns but non-identical failures.

In an embodiment, during step 350 the diagnosis engine may perform additional analysis to further group devices and realize further additional efficiency gains. For example, the diagnosis engine may perform cluster analysis to further group the devices, one or more clustering techniques. These clustering techniques may include the simplest k-means clustering vector quantization method or other clustering techniques. It is understood the diagnosis engine may apply other one or more other techniques, alone or in combination, and the present disclosure is not limited solely to the application of k-means clustering.

Returning to step 335, in an embodiment the diagnosis engine may identify devices having identical failing patterns and identical failures. In these cases, the failure grouping process may take the "YES" option at step 340, and proceeds to step 355. During step 355, the devices with identical failing patterns and identical failures may be identified and assembled for further classification among themselves.

In an embodiment, during step 360, the diagnosis engine may group devices having identical failing patterns and identical failures. These groups of devices may be diagnosed most efficiently by multiple device diagnosis, and may achieve the highest efficiency gains of any group assembled by the failure grouping process.

In an embodiment, during step 365 the diagnosis engine may perform additional analysis to further group devices and realize further additional efficiency gains. For example, the diagnosis engine may perform cluster analysis to further group the devices, using one or more clustering techniques. These clustering techniques may include the simplest k-means clustering vector quantization method or other clustering techniques. It is understood the diagnosis engine may apply other one or more other techniques, alone or in combination, and the present disclosure is not limited solely to the application of k-means clustering.

In an embodiment upon the conclusion of the failure grouping process, the diagnosis engine may output a fail data directory. For example, this may be the output fail data directory step 230 illustrated in FIG. 2 and described above.

Figure 4:
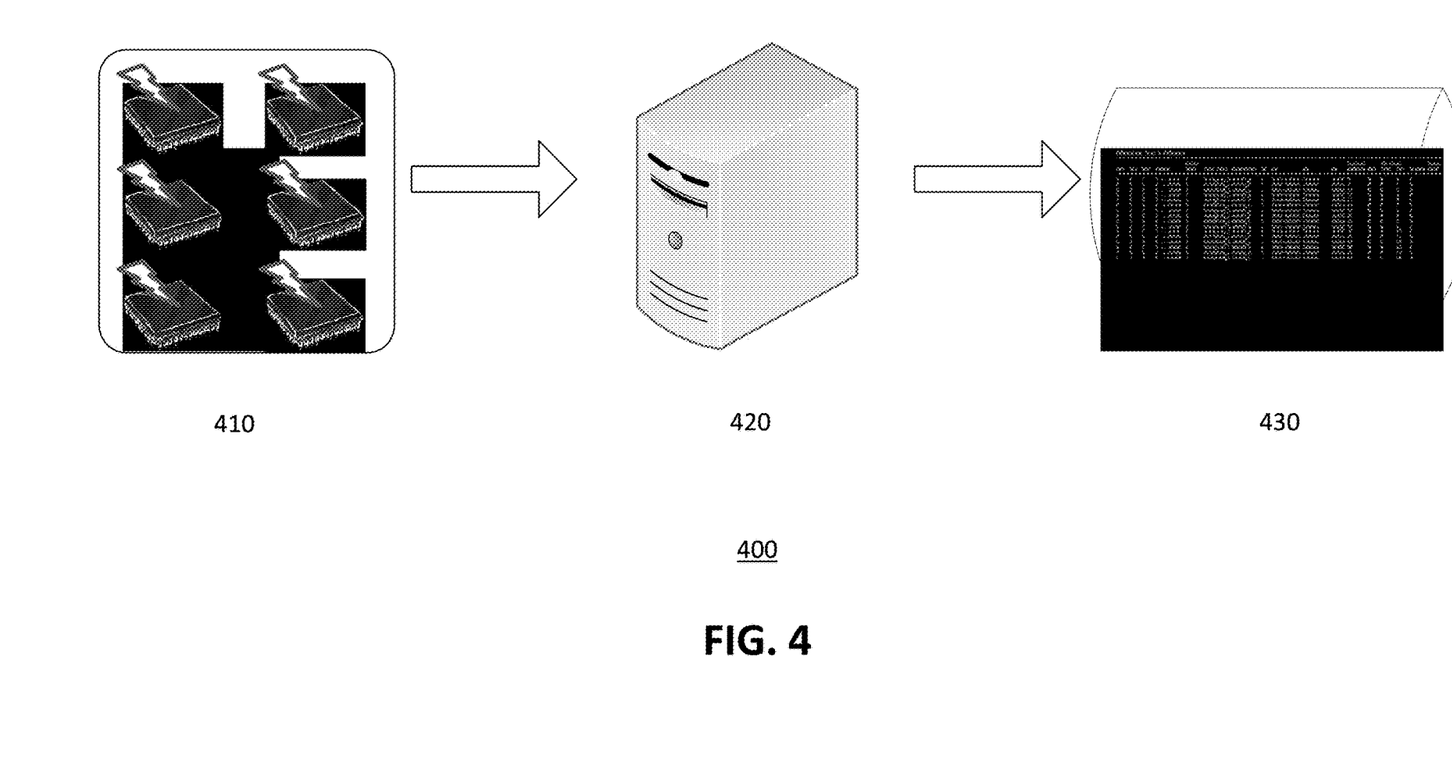
FIG. 4 illustrates an example embodiment of a multiple device diagnostic system.

FIG. 4 illustrates a multiple device diagnosis system 400 according to an example embodiment. As shown in FIG. 4, the multiple device diagnosis system 400 includes a plurality of electronic devices 410, a diagnosis engine 420, and a diagnosis results database 430. In an embodiment, the plurality of electronic devices 410 may be electronic devices, such as integrated circuits, for example. In embodiments, the electronic devices that compose the plurality of electronic devices 410 may be chosen in a variety of ways. For example, the plurality of electronic devices 410 may be composed of a random selection of a subset of electronic devices to be tested, or the selection of devices for inclusion in the plurality of electronic devices 410 may be based on characteristics, such as design, components, materials, method of manufacture, method of assembly, manufacturer(s), supplier(s), manufacturing batch, anticipated or projected diagnosis results, diagnosis results of other electronic devices having similar characteristics, testing results, testing results of other electronic devices having similar characteristics, or other identifiable criteria. These selection characteristics may be used individually or in combination with other selection characteristics, or with other characteristics.

In an embodiment, the diagnosis engine 420 may be the diagnosis engine 120 previously discussed with referenced to FIG. 1, or another software program capable of diagnosis failures in a plurality of electronic devices. The diagnosis engine 420 may be executed by a processor or by multiple processors, and may be connected with computer peripherals, such as a monitor, printer, and input/output devices. The diagnosis engine 420 may be locally stored or available remotely on a network drive or at a cloud location and, for example, may be stored upon and/or executed by a desktop computer, a laptop computer, a tablet computer, a smartphone, a server, or other computing machine, or any combination of these machines. If multiple machines are employed, a data communication between the machines can be implemented using wired, wireless, or network connections. In an embodiment, the diagnosis engine 420 may be supported by testing hardware, including one or more multimeters, ohmmeters, test probes and leads, read/write ports, moisture meters, voltage meters, continuity testers, thermometers, sound level meters, light testers, humidity meters, pressure meters, and thermocouples. While this testing hardware is listed as exemplary, it is understood that the systems and methods of the present disclosure are not limited thereto and instead may incorporate any testing equipment capable of providing computer-readable data input.

While embodiments describe the diagnosis engine 420 performing testing and diagnosis, it is understood that the diagnosis engine of the present disclosure may not perform testing. In other embodiments, the diagnosis engine 420 may identify defects based on previously collected testing data, and may not perform testing itself. In another embodiment, the diagnosis engine 420 may identify defects by applying grouped failure pattern data to the failing patterns reported by devices similar to or associated with the plurality of electronic devices 410. In another embodiment, the diagnosis engine 420 may perform testing and/or diagnosis by simulation.

In an embodiment, the diagnosis engine 420 may access the output fail data directory generated by the failure grouping method of the present disclosure. Using this failure grouping data, the diagnosis engine 420 may test and diagnose the plurality of electronic devices 410. The diagnosis test engine 420 may identify or more defects in the plurality of electronic devices 410, and the diagnosis results may be stored the diagnosis results database 430. It is understood that the multiple device diagnosis system 400 is not limited to the diagnosis of a plurality of electronic devices 410, and embodiments of the multiple device diagnosis system 400 may be used to test and diagnosis defects in a single electronic device.

In an embodiment, the diagnosis engine 420 may output the results of the testing and diagnosis to the diagnosis results database 430. The diagnosis engine 420 may be in data communication with the diagnosis results database 430. The diagnosis results database 430 may be a relational database, a non-relational database, or another form of database, and may be configured to support the testing and diagnosis performed by the diagnosis engine 420. The database 430 may be stored locally, such as memory on the same computer or diagnosis platform that supports the diagnosis engine 120 (this memory includes both internal and external memory, e.g., a hard drive or a flash drive), or may be available remotely via a network drive or cloud location.

Figure 5:
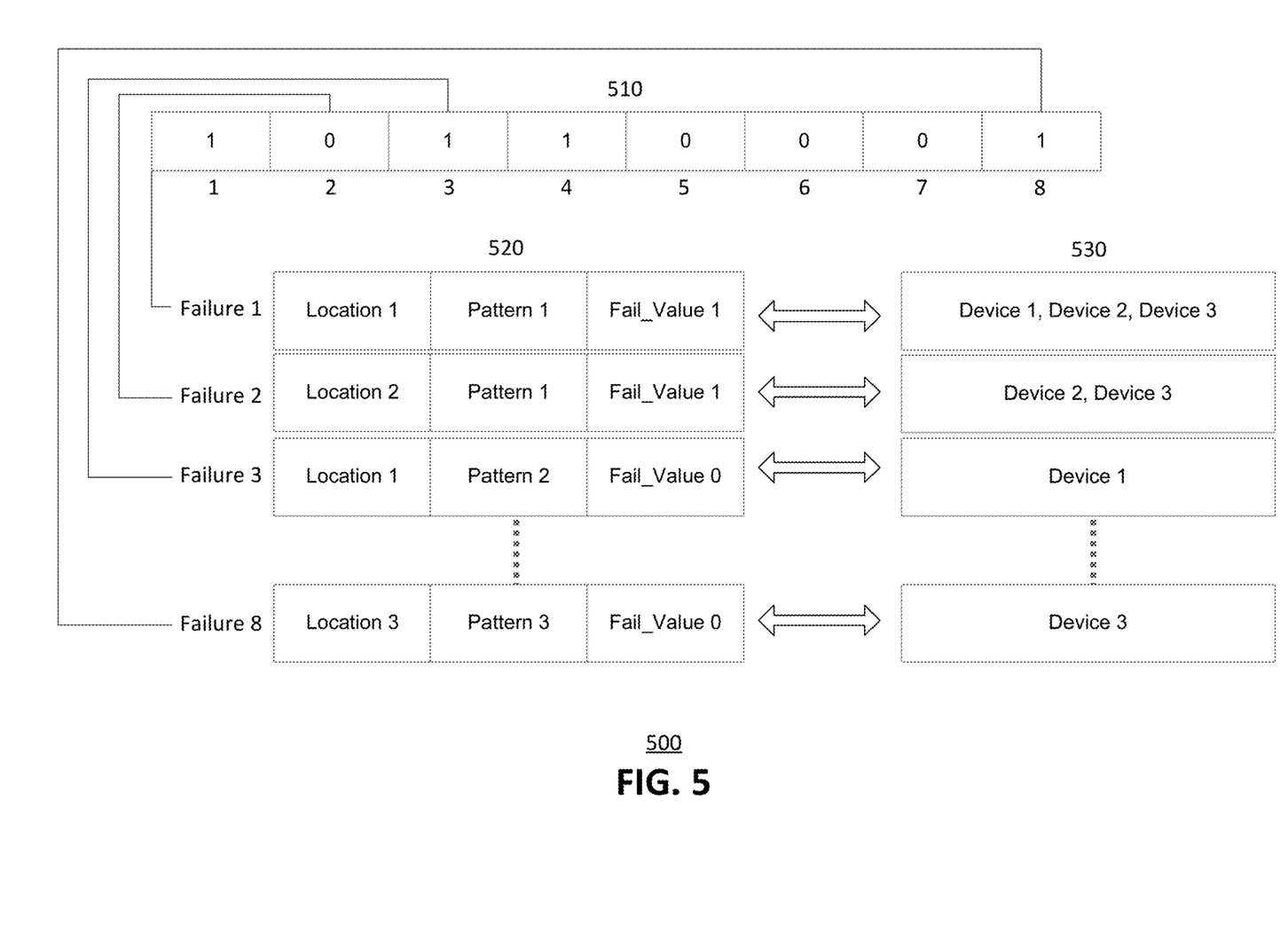
FIG. 5 illustrates an example embodiment of diagnosis data generated by the multiple device diagnostic system.

FIG. 5 illustrates the diagnosis data 500 generated by the multiple device diagnosis system 400, which may be stored in the diagnosis results database 430. As shown in FIG. 5, for each defect detected during diagnosis, an array 510 may be created in memory. In an embodiment, the array 510 may be of a size that this is the union of the instances of the defect. The array 510 may be a bit array, or the elements of the array 510 may be of another size. Each element of the array 510 may have one of two values that indicate whether a specific failure can cause the defect. For example, each element of the array 510 may have a value of "1" or "0," where a value of "1" indicates that the failure can cause the defect and a value of "0" indicates that this failure cannot cause the defect.

In an embodiment, the diagnosis data 500 may include a unique defects list 520 across all diagnosed electronic devices. The unique defects list 520 may include a "Location" variable indicating the specific location of the failure, such as, for example, the specific electronic device or combination of devices where the failure was detected. The list of unique defects 520 may further include a "Pattern" variable indicating the specific failing pattern that resulted in the failure and a "Fail_Value" variable indicating the observed value during the application of the failing pattern.

In an embodiment, the diagnosis data may further include a device list 530 which stores all electronic devices where the failure occurred. For example, an entry in the device list 530 may identify one electronic device having a diagnosed failure or a combination of electronic devices if the failure was identified by diagnosing a combination of devices.

In the embodiment illustrated in FIG. 5, the array 510 may be a bit array, with each element assigned a value of "1" if the defect can be caused by the identified failure or a value of "0" if the failure cannot cause this defect. Each element of the array 510 may be associated with an entry in the unique defects list 520, and each entry in the unique defects list 520 may be associated with an entry in the device list 530. Thus, each element of the array 510 may have a one-to-one relation with the unique defects list 520 and may have a one-to-many relation the electronic devices. In this manner, the number of failures identified for each electronic device may be identified. In the embodiment illustrated in FIG. 5 each of the electronic devices are diagnosed with the failures listed in Table 1:

TABLE 1

| Electronic Device | Diagnosed Failures |
| --- | --- |
| Device 1 | 1, 3, 4, 5 |
| Device 2 | 1, 2, 7 |
| Device 3 | 1, 2, 6, 8 |

The multiple device diagnostic system of the present disclosure may provide significant performance gains. For example, multiple device diagnosis run-time gains of 10× or more when electronic devices are pooled randomly, and may exhibit greater gains when electronic devices are pooled based on similarities including, for example, one or more of similarities in device design, similarities to devices previously diagnosed, and similarities to the grouped failure data. Additional performance gains may be achieved as the number of pooled electronic devices increases. These performance gains may be seen when diagnosing electronic devices having simple or complex design. Further, the performance gains may significantly exceed any consequential increases in memory or system resources utilized during the multiple device diagnosis.

Table 2 presents experimental results for the diagnosis of randomly-pooled electronic devices by embodiments of the multiple device diagnostic system according to the present invention in comparison to serial diagnosis runs. As shown in Table 2, the multiple device diagnosis system achieves significant performance gains that exceed the memory increases required for the performance of multiple device diagnosis. Table 2 further shows that these performance gains become greater as the number of electronic devices in a multiple device diagnosis run increases.

TABLE 2

| Number of Failing Devices in MDD Run | Performance Gain | Memory Increase |
| --- | --- | --- |
| 50 | 4.29x | 1.1x |
| 100 | 7.24x | 1.24x |
| 200 | 10.49x | 1.4x |
| 400 | 11.96x | 1.9x |
| 800 | 12.19x | 2.76x |

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

What is claimed is:

1. A multiple device diagnostic system, comprising:
   a memory storing machine-readable instructions comprising a diagnosis engine in communication with a failure database comprising grouped failure data from previously diagnosed electronic devices; and
   a processor to execute the machine-readable instructions to execute the diagnosis engine, the diagnosis engine causing the processor to:
   determine defects in one or more electronic devices selected for diagnosis based on the grouped failure data, wherein the one or more electronic devices are selected for the diagnosis based on at least one selection criteria; and
   output diagnosis data characterizing the defects in the one or more electronic devices to a diagnosis results database in communication with the diagnosis engine.

2. The multiple device diagnostic system of claim 1, wherein the at least one selection criterion is random selection.

3. The multiple device diagnostic system of claim 1, wherein the at least one selection criterion is at least one of design similarity, manufacture similarity, function similarity, manufacturer similarity, component similarity, and material similarity.

4. The multiple device diagnostic system of claim 1, wherein the grouped failure data is grouped according to subsumability of failing patterns.

5. The multiple device diagnostic system of claim 1, wherein the grouped failure data includes grouped identical failing patterns and grouped non-identical failing patterns.

6. The multiple device diagnostic system of claim 5, wherein the identical failing pattern data includes grouped identical failures and grouped non-identical failures.

7. The multiple device diagnostic system of claim 1,
wherein the diagnosis results database comprises an array having one or more elements indicative of whether a diagnosed defect is caused by an identified failure,
wherein the diagnosis results database further comprises a list of unique defects having entries for each defect diagnosed in the one or more electronic devices, and
wherein each element of the array is associated with at least one entry in the list of unique defects.

8. The multiple device diagnostic system of claim 7,
wherein the diagnosis results database comprises a device list having entries for each of the one or more electronic devices where a failure occurred, and
wherein each entry in the list of unique defects is associated with an entry in the device list.

9. The multiple device diagnosis system of claim 1, further comprising at least one of a multimeter, an ohmmeter, a test probe, a read/write port, a moisture meter, a voltage meter, a continuity tester, a thermometer, a sound level meter, a light tester, a humidity meter, a pressure meter, and a thermocouple.

10. The multiple device diagnosis system of claim 1,
wherein the grouped failure data comprises a first failure group and a second failure group,
wherein the first failure group characterizes failures of a first subset of a plurality of previously diagnosed electronic devices that have similar failure characteristics corresponding to similar failing patterns, and
wherein the second failure group characterizes failures of a second subset of the plurality of previously diagnosed electronics devices that do not have similar failure characteristics corresponding to non-identical failing patterns.

11. A method for diagnosing multiple electronic devices, the method comprising:
selecting a plurality of electronic devices for diagnosis based on at least one selection criterion;
diagnosing defects in one or more of the plurality of electronic devices by a diagnosis engine using grouped failure data from at least one previously diagnosed electronic devices; and
outputting diagnosis results characterizing the defects in the one or more of the plurality of electronic devices to a diagnosis results database.

12. The method for diagnosing multiple electronic devices of claim 11, wherein the at least one selection criterion is random selection.

13. The method for diagnosing multiple electronic devices of claim 11, wherein the at least one selection criterion is at least one of design similarity, manufacture similarity, function similarity, manufacturer similarity, component similarity, and material similarity.

14. The method for diagnosing multiple electronic devices of claim 11, wherein the grouped failure data is grouped according to subsumability of failing patterns.

15. The method for diagnosing multiple electronic devices of claim 11, wherein the grouped failure data includes grouped identical failing patterns and grouped non-identical failing patterns.

16. The method for diagnosing multiple electronic devices of claim 15, wherein the identical failing pattern data includes grouped identical failures.

17. The method for diagnosing multiple electronic devices of claim 11,
wherein the diagnosis results database comprises an array having one or more elements indicating whether a diagnosed defect is caused by an identified failure,
wherein the diagnosis results database further comprises a list of unique defects having entries for each defect diagnosed in the one or more of the plurality of electronic devices, and
wherein each element of the array is associated with at least one entry in the list of unique defects.

18. The method for diagnosing multiple electronic devices of claim 17,
wherein the diagnosis results database comprises a device list having entries for each of the one or more of the plurality of electronic devices where a failure occurred, and
wherein each entry in the list of unique defects is associated with an entry in the device list.

19. A system comprising:
a memory storing machine-readable instructions comprising a diagnosis engine; and
a processor to execute the machine-readable instructions to execute the diagnosis engine, the diagnosis engine causing the processor to:
receive failure data characterizing failures of previously diagnosed electronic devices, the failure data being stored at a failure database;
diagnosis defects in one or more electronic devices based on the failure data, the one or more electronic devices being selected for the diagnosis based on at least one selection criteria;
generate diagnosis data characterizing the diagnosis defects in the one more electronic devices; and
store the diagnosis data in a diagnosis results database.

20. The system of claim 19, wherein the failure data comprises a plurality of failure groups, and a first subset of the plurality of failure groups characterizes failures of a first subset of the previously diagnosed electronic devices that have similar failure characteristics corresponding to similar failing patterns, and a second subset of the plurality of failure groups characterizes failures of a second subset of the previously diagnosed electronics devices that do not have similar failure characteristics corresponding to non-identical failing patterns.

* * * * *